United States Patent
Hsu et al.

(10) Patent No.: US 7,086,024 B2
(45) Date of Patent: Aug. 1, 2006

(54) METHODS AND APPARATUS FOR DEFINING POWER GRID STRUCTURES HAVING DIAGONAL STRIPES

(75) Inventors: Hengfu Hsu, Cupertino, CA (US); Steven Teig, Menlo Park, CA (US); Akira Fujimura, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/452,848

(22) Filed: Jun. 1, 2003

(65) Prior Publication Data

US 2004/0243960 A1  Dec. 2, 2004

(51) Int. Cl.
*G06F 17/50* (2006.01)
*G06F 9/45* (2006.01)

(52) U.S. Cl. ............................ 716/8; 716/12; 716/13; 716/14

(58) Field of Classification Search ............... 716/1–14; 257/676, 786
See application file for complete search history.

(56) References Cited

U.S. PATENT DOCUMENTS

| | | | |
|---|---|---|---|
| 6,111,756 A | 8/2000 | Moresco | |
| 6,202,191 B1 | 3/2001 | Filippi et al. | |
| 6,305,000 B1 | 10/2001 | Phan et al. | |
| 6,388,332 B1 | 5/2002 | Aggarwal et al. | |
| 6,437,431 B1 * | 8/2002 | Mbouombouo et al. | .... 257/676 |
| 6,446,245 B1 | 9/2002 | Xing et al. | |
| 6,553,554 B1 | 4/2003 | Dahl et al. | |
| 6,598,206 B1 | 7/2003 | Darden et al. | |
| 6,622,294 B1 | 9/2003 | Saxena et al. | |
| 6,675,139 B1 * | 1/2004 | Jetton et al. | ................... 703/17 |
| 2002/0170020 A1 * | 11/2002 | Darden et al. | ................. 716/2 |
| 2004/0139417 A1 * | 7/2004 | Allen et al. | ................... 716/19 |
| 2005/0023705 A1 * | 2/2005 | Campbell et al. | ........... 257/786 |

\* cited by examiner

*Primary Examiner*—A. M. Thompson
*Assistant Examiner*—Magid Y. Dimyan
(74) *Attorney, Agent, or Firm*—Stattler, Johansen & Adeli, LLP (57) ABSTRACT

A method for defining and producing a power grid structure of an IC having diagonal power and ground stripes. Stripes are placed in a 45° or 135° diagonal direction in relation to an IC layout's x-coordinate axis so that the stripes will be placed in a 45° or 135° diagonal direction, respectively, in relation to the bottom boundary of the resulting IC. The diagonal power and ground stripes are beneficial to diagonal signal wiring. The stripes may be placed across one layer of the IC or across more than one layer of the IC. The diagonal power stripes may have varying widths and/or varying spacing widths on a layer of the IC. The diagonal ground stripes may have varying widths and/or varying spacing widths on a layer of the IC.

23 Claims, 8 Drawing Sheets

METHODS AND APPARATUS FOR DEFINING POWER GRID STRUCTURES HAVING DIAGONAL STRIPES

FIELD OF THE INVENTION

The invention is directed towards methods and apparatus for defining power grid structures having diagonal stripes for use in an integrated circuit.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of signal wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers.

One example of a PD wiring model is the PD Manhattan wiring model, which specifies alternating layers of preferred-direction horizontal and vertical wiring. Another example of a PD wiring model is the PD diagonal wiring model, which specifies alternating layers of preferred-direction diagonal wiring. The PD diagonal wiring model can allow for shorter wiring distances than the PD Manhattan wiring model and can decrease the total wirelength needed to interconnect the electronic and circuit components of an IC. The PD diagonal wiring model is described in detail in U.S. patent application Ser. No. 10/334,690, filed Dec. 31, 2002, entitled "Method and Apparatus for Routing," incorporated herein by reference and U.S. patent application Ser. No. 10/013,819, filed Dec. 7, 2001, entitled "Routing Method and Apparatus That Use Diagonal Routes," incorporated herein by reference.

Design engineers design IC's by transforming logical or circuit descriptions of the IC's into geometric descriptions, called layouts. IC layouts typically include (1) circuit modules (i.e., geometric representations of electronic or circuit IC components) with signal pins, and (2) interconnect lines (i.e., geometric representations of signal wiring) that connect the signal pins of the circuit modules. A signal net is typically defined as a collection of signal pins that need to be connected.

To create layouts, design engineers typically use electronic design automation ("EDA") applications. These applications provide sets of computer-based tools for creating, editing, and analyzing IC design layouts. One EDA tool is a signal wire router that defines routes for interconnect lines that connect the signal pins of signal nets. Signal wire routing is generally divided into two phases: global signal routing and detailed signal routing. For each signal net, global signal routing generates a "loose" route for the interconnect lines that are to connect the signal pins of the signal net. The "looseness" of a global signal route depends on the particular global signal router used. After global signal routes have been created, the detailed signal routing creates specific individual routes for each signal net. A signal wire router that consistently explores diagonal wire routing directions (referred to herein as a diagonal wire router) is described in the aforementioned patent application titled "Method and Apparatus for Routing."

Each IC also contains a power grid structure that provides power and ground to each electronic and circuit component of an IC. Each electronic or circuit IC component has a power pin and a ground pin that is connected to the power grid structure. A power net is typically defined as a collection of power pins that need to be connected and a ground net is typically defined as a collection of ground pins that need to be connected. The power grid structure is described in the IC layout and is later physically created for use in an IC based on the descriptions in the IC layout. As an IC includes multiple layers, an IC layout also includes descriptions of multiple layers.

Power grid structure components include stripes, rails, and vias which must be of a certain strength (i.e., size) to meet design specifications (i.e., minimum specifications that the power grid structure must meet in order to be acceptable for use in the IC). Power grid components, however, compete with signal wiring for area on an IC layer since they take up area on the IC layer that signal wiring could otherwise occupy. Also, power grid structure components can cause substantial blockage of signal wiring paths, especially on layers with the PD diagonal wiring model.

Figure 1:
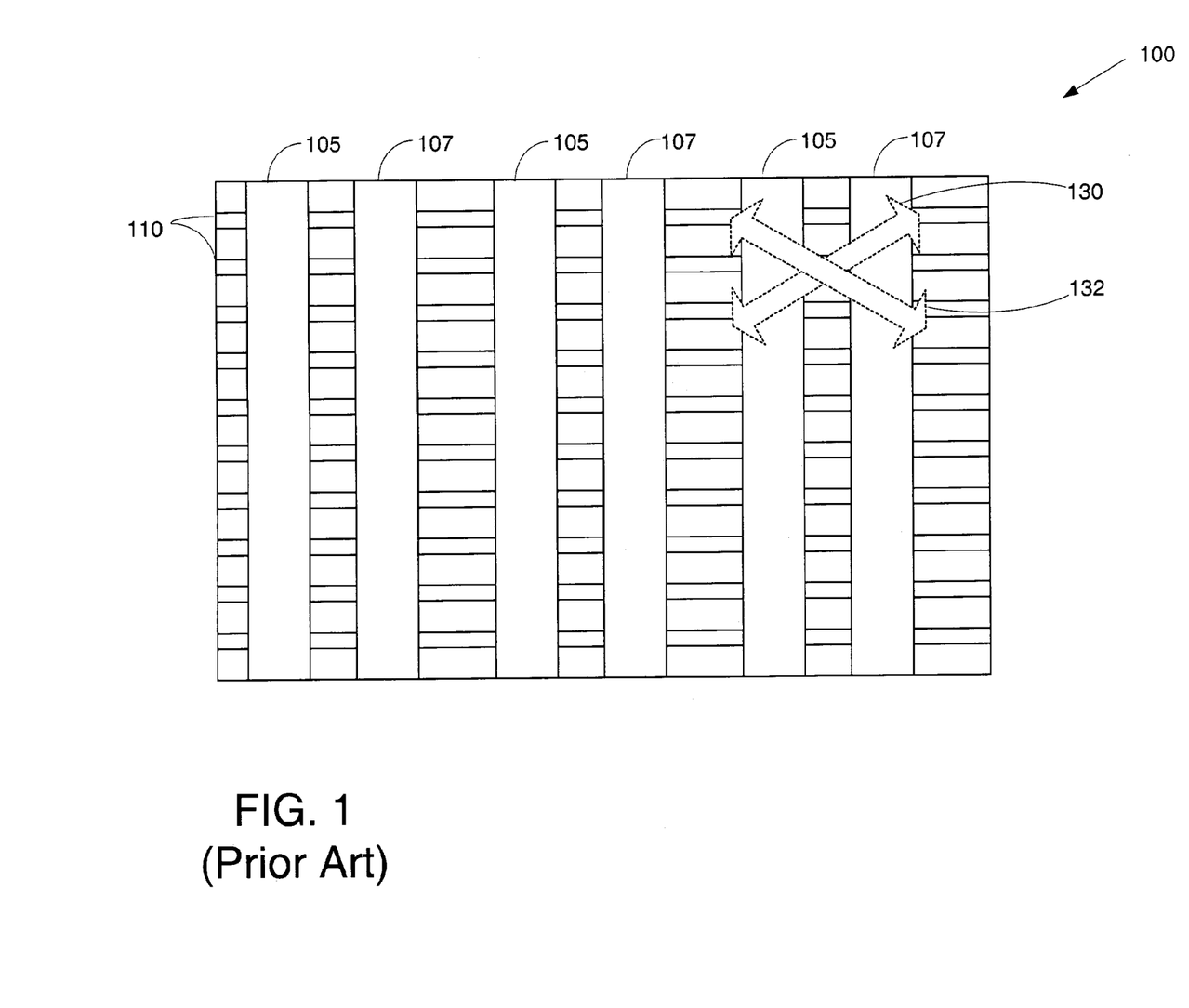
FIG. 1 illustrates a top view of a region of an IC layout having a conventional power grid structure.

FIG. 1 illustrates a top view of a region of an IC layout having a conventional power grid structure 100. The power grid structure 100 includes stripes 105 and 107 and rails 110. Stripes 105 and 107 are typically positioned vertically (i.e., parallel to the layout's y-coordinate axis) or horizontally (i.e., parallel to the layout's x-coordinate axis) across at least one upper layer of the IC and provide power and ground to the IC. Power grid stripes that are positioned vertically or horizontally are referred to as Manhattan power grid stripes. A stripe that carries power is referred to as a power stripe 105 and a stripe that carries ground is referred to as a ground stripe 107.

Rails 110 are typically positioned horizontally (i.e., parallel to the layout's x-coordinate axis) or vertically (i.e., parallel to the layout's y-coordinate axis) across at least one lower layer of the IC. Each rail is connected to either a power stripe 105 or a ground stripe 107 through vias (not shown). Vias are positioned perpendicular to the IC's layers (i.e., parallel to the layout's z-coordinate axis) and distribute power or ground from the stripes to the rails.

Stripes 105 and 107 occupy area on a layer of the IC and can cause blocking of the signal wiring needed to interconnect the electronic and circuit components of the IC. The amount of wiring blockage varies from layer to layer depending on the PD wiring model of the layer. Conventional Manhattan power grid stripes, however, can cause near complete blockage of diagonal signal wiring. As shown in FIG. 1, a 45° diagonal direction arrow 130 and a 135° diagonal direction arrow 132 illustrate how diagonal wiring paths are blocked by stripes 105 and 107 of the conventional power grid structure 100. Therefore, there is a need for a method and apparatus for reducing the diagonal wiring blockage caused by stripes of a power grid structure while still meeting the design specifications for the power grid structure.

SUMMARY OF THE INVENTION

Processes of the invention provide a method for defining and producing a power grid structure in an IC layout, the power grid structure having diagonal power and ground stripes. The method includes determining values for power stripes of the power grid structure which include a power stripe width, a power stripe start spacing, a power stripe spacing width, and a power stripe end spacing. The method also includes determining values for ground stripes of the power grid structure which include a ground stripe width, a ground stripe start spacing, a ground stripe spacing width, and a ground stripe end spacing.

In some embodiments, the stripes are placed in a 45° diagonal direction in relation to the layout's x-coordinate axis so that the stripes will be placed in a 45° diagonal direction in relation to the bottom boundary of the resulting IC. In other embodiments, the stripes are placed in a 135° diagonal direction in relation to the layout's x-coordinate axis so that the stripes will be placed in a 135° diagonal direction in relation to the bottom boundary of the resulting IC. The stripes are may be placed across one layer of the IC or across more than one layer of the IC.

Further embodiments include power grid structures having diagonal power stripes with varying widths and/or diagonal ground stripes with varying widths. Power grid structures of the present invention may also have diagonal power stripes with varying spacing widths and/or diagonal ground stripes with varying spacing widths. Power grid structures of the present invention may also have any combination of the above described characteristics.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Processes of the invention provide a method for defining and producing a power grid structure in an IC layout, the power grid structure having diagonal power and ground stripes. The method includes determining values for power stripes of the power grid structure which include a power stripe width, a power stripe start spacing, a power stripe spacing width, and a power stripe end spacing. The method also includes determining values for ground stripes of the power grid structure which include a ground stripe width, a ground stripe start spacing, a ground stripe spacing width, and a ground stripe end spacing.

In some embodiments, the stripes are placed in a 45° diagonal direction in relation to the layout's x-coordinate axis so that the stripes will be placed in a 45° diagonal direction in relation to the bottom boundary of the resulting IC. In other embodiments, the stripes are placed in a 135° diagonal direction in relation to the layout's x-coordinate axis so that the stripes will be placed in a 135° diagonal direction in relation to the bottom boundary of the resulting IC. The stripes are may be placed across one layer of the IC or across more than one layer of the IC.

The above described embodiments of the invention are described below in relation to section I. Further embodiments of the present invention include power grid structures having diagonal power stripes with varying widths and/or diagonal ground stripes with varying widths. Power grid structures of the present invention may also have diagonal power stripes with varying spacing widths and/or diagonal ground stripes with varying spacing widths. Power grid structures of the present invention may also have any combination of the above described characteristics. These embodiments are described below in relation to section II.

In the embodiments described below, the power grid structure is described in relation to a six-layer wiring model that has horizontal preferred signal wiring on wiring layer 1, vertical preferred signal wiring on wiring layer 2, horizontal preferred signal wiring on wiring layer 3, 45° diagonal preferred signal wiring on wiring layer 4, 135° diagonal preferred signal wiring on wiring layer 5, and vertical preferred wiring on wiring layer 6. One of ordinary skill in the art will realize that the power grid structure can be used in other wiring models in other embodiments.

In some embodiments, an interconnect line or power grid stripe is "diagonal" if it forms an angle other than 0° or 90° with respect to the IC layout's Cartesian coordinate axes, which are typically parallel with the layout's boundary and/or the boundary of the layout's expected IC. An interconnect line or power grid stripe is "horizontal" or "vertical" if it forms an angle of 0° or 90° with respect to one of the coordinate axes of the layout.

A power grid stripe that is "diagonal" with respect-to the IC layout's (or a region of the layout's) coordinate axes or boundary is also "diagonal" (i.e., forms an angle other than 0° or 90°) with respect to the boundary of the resulting IC and the boundary of the resulting layer on which the stripe is placed. Similarly, a power grid stripe that is "horizontal" or "vertical" with respect to the IC layout's (or a region of the layout's) coordinate axes or boundary is also "horizontal" or "vertical" (i.e., forms an angle of 0° or 90°) with respect to the boundary of the resulting IC and the boundary of the resulting layer on which the stripe is placed. In some embodiments, power grid structures having stripes with the specific diagonal directions of 45° or 135° are described. Other embodiments, however, include power grid structures having stripes with the other diagonal directions.

As used herein, the term "intersection" refers to-a location where a stripe and rail cross in terms of an IC layout's x and y-coordinate axes, and does not refer to an actual physical intersection of the stripe and rail. As used herein, the term "region of an IC layout" may refer to a portion of the IC layout or the entirety of the IC layout diagonal wire. Also, in several embodiments described below, distances (e.g., the width or length of a stripe, the spacing width between stripes, etc.) may be measured using different methods known in the art, so long as the same method is used consistently to implement any of the embodiments.

Figure 2:
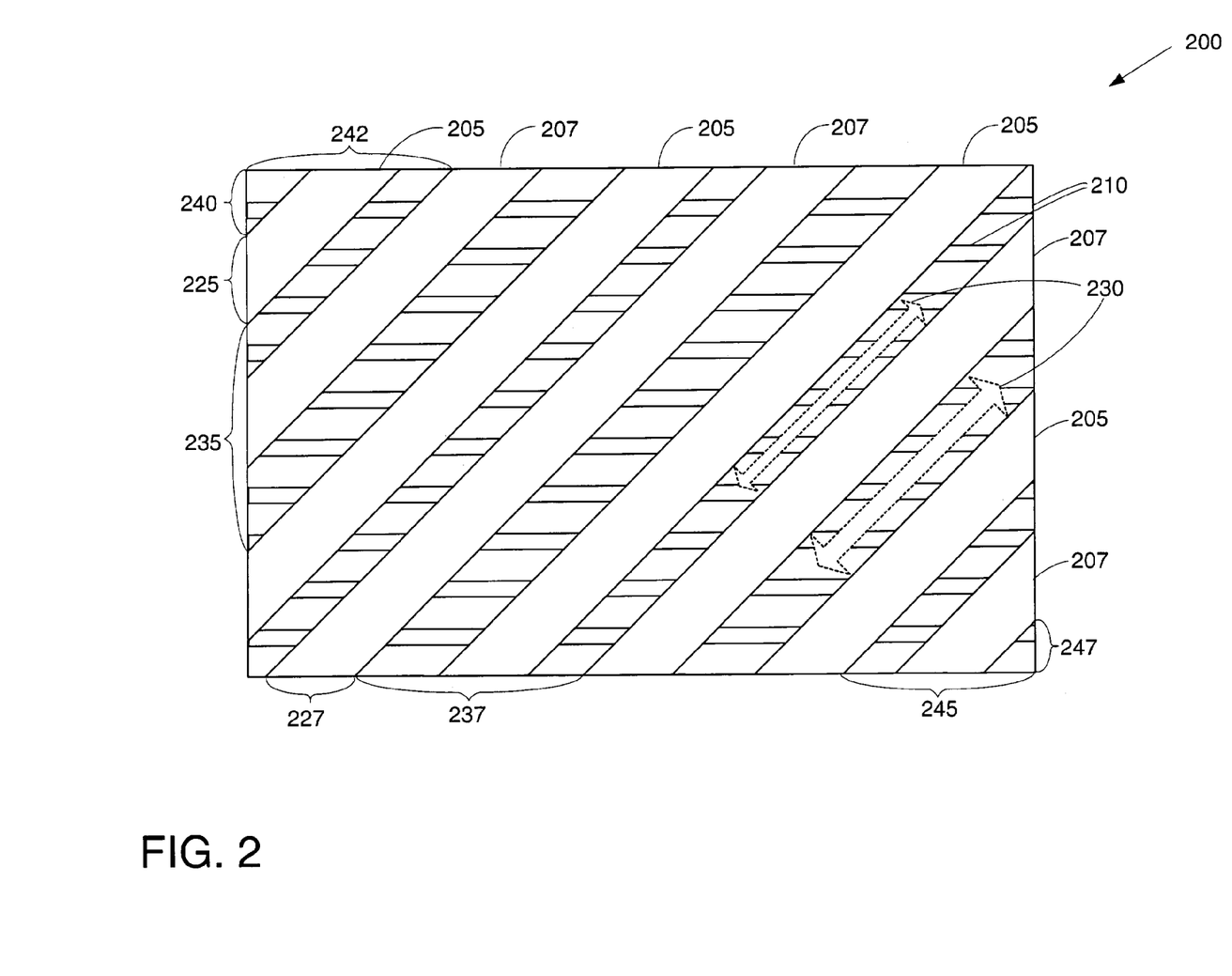
FIG. 2 illustrates a top view of a region of an IC layout having a power grid structure with 45° diagonal stripes in accordance with the present invention.

I. FIG. 2 illustrates a top view of a region of an IC layout having a power grid structure 200 with 45° diagonal stripes 205 and 207 in accordance with the present invention. The power grid structure 200 includes stripes 205 and 207 and rails 210. Stripes 205 and 207 are positioned parallel to one another across an upper layer of the IC and provide power and ground to the IC. The stripes 205 and 207 are placed in a 45° diagonal direction in relation to the layout's x-coordinate axis or bottom boundary. As such, the stripes 205 and 207 will be placed in a 45° diagonal direction in relation to the bottom boundary of the resulting IC and the bottom boundary of the resulting layer on which the stripes 205 and 207 are placed.

A stripe that carries power is referred to as a power stripe 205. The width of the power stripe 205 is referred to as the power stripe width 225. The locations of the power stripes 205 are defined by a first distance (in terms of x or y-coordinates) from an edge of the layout region to a first power stripe 205, a second distance between power stripes 205 thereafter (i.e., a spacing width that separates a power stripe 205 from a next power stripe 205), and a third distance (in terms of x or y-coordinates) from an edge of the layout region to a last power stripe 205. The first distance is referred to as a power stripe start spacing 240, the second distance is referred to as a power stripe spacing width 235, and the third distance is referred to as a power stripe end spacing 245.

A stripe that carries ground is referred to as a ground stripe 207. The width of the ground stripe 207 is referred to as the ground stripe width 227. The locations of the ground stripes 207 are defined by a first distance (in terms of x or y-coordinates) from an edge of the layout region to a first ground stripe 207, a second distance between ground stripes 207 thereafter (i.e., a spacing width that separates a ground stripe 207 from a next ground stripe 207), and a third distance (in terms of x or y-coordinates) from an edge of the layout region to a last ground stripe 207. The first distance is referred to as a ground stripe start spacing 242, the second distance is referred to as a ground stripe spacing width 237, and the third distance is referred to as a ground stripe end spacing 247.

Rails 210 are positioned parallel to one another and horizontally (i.e., parallel to the layout's x-coordinate axis) across at least one lower layer of the IC. Each rail is connected to a power or ground stripe through vias (not shown) and distribute power or ground to each electronic and circuit component (not shown) of the IC.

On the layer where the stripes 205 and 207 are placed, areas between the stripes 205 and 207 define wiring tracks (i.e., wiring capacity) where signal wiring required for the IC layout (i.e., wiring demand) can be routed. Wiring tracks that allow horizontal, vertical, or diagonal wiring on the layout are referred to as horizontal, vertical, or diagonal wiring tracks, respectively. The power grid structure 200 of the present invention has 45° diagonal stripes that allow 45° diagonal wiring tracks between the stripes 205 and 207. Two 45° diagonal direction arrows 230 illustrate how 45° diagonal wiring tracks are formed between the stripes 205 and 207 where 45° diagonal signal wiring can be routed. In some embodiments, the stripes 205 and 207 are placed on layer 4 of the six-layer wiring model, layer 4 having 45° diagonal preferred wiring. In other embodiments, the stripes 205 and 207 are placed on another layer.

Figure 3:
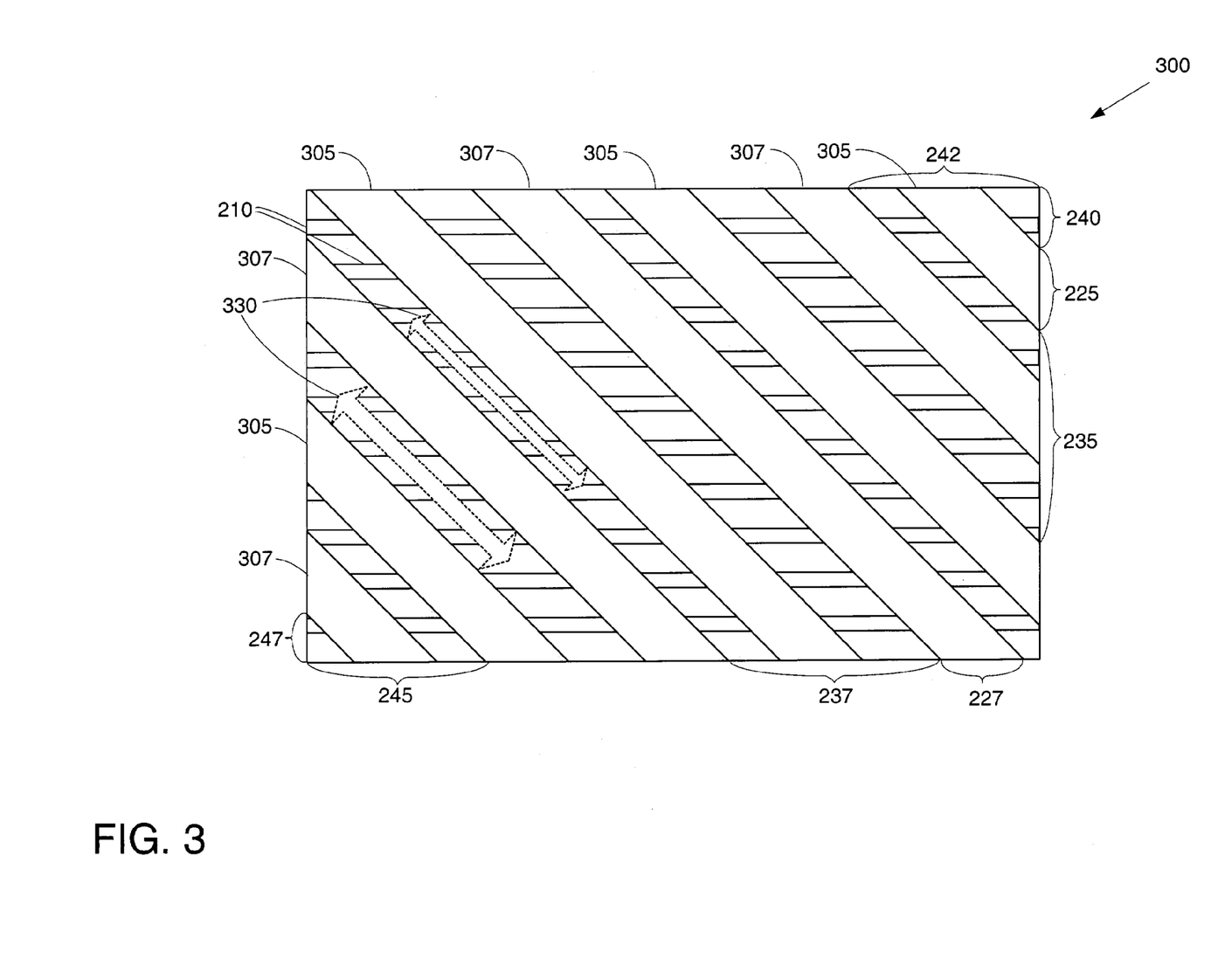
FIG. 3 illustrates a top view of a region of an IC layout having a power grid structure with 135° diagonal stripes in accordance with the present invention.

FIG. 3 illustrates a top view of a region of an IC layout having a power grid structure 300 with 135° diagonal stripes 305 and 307 in accordance with the present invention. The power grid structure 300 is similar to the power grid structure 200 of FIG. 2 except that the stripes 305 and 307 of the power grid structure 300 are placed in a 135° diagonal direction in relation to the layout's x-coordinate axis or bottom boundary. As such, the stripes 305 and 307 will be placed in a 135° diagonal direction in relation to the bottom boundary of the resulting IC and the bottom boundary of the resulting layer on which the stripes 305 and 307 are placed.

The power grid structure 30° has 135° diagonal stripes that allow 135° diagonal wiring tracks between the stripes 305 and 307. Two 135° diagonal direction arrows 330 illustrate how 135° diagonal wiring tracks are formed between the stripes 305 and 307 where 135° diagonal signal wiring can be routed. In some embodiments, the stripes 305 and 307 are placed on layer 5 of the six-layer wiring model, layer 5 having 135° diagonal preferred wiring. In other embodiments, the stripes 305 and 307 are placed on another layer.

FIGS. 2 and 3 show power grid structures having diagonal power grid stripes across an upper layer of an IC. In some embodiments, all power grid stripes placed on the upper layer are diagonal power grid stripes. In other embodiments, the upper layer of the IC also contains Manhattan power grid stripes and the diagonal power grid stripes comprise a certain portion of the total number of power grid stripes placed on the upper layer. In some embodiments, the number of diagonal power grid stripes comprise over ¼, over ⅓, or over ½ the total number of power grid stripes on the upper layer. In other embodiments, the number of diagonal power grid stripes comprise portions of other values of the total number of power grid stripes on the upper layer.

Figure 4:
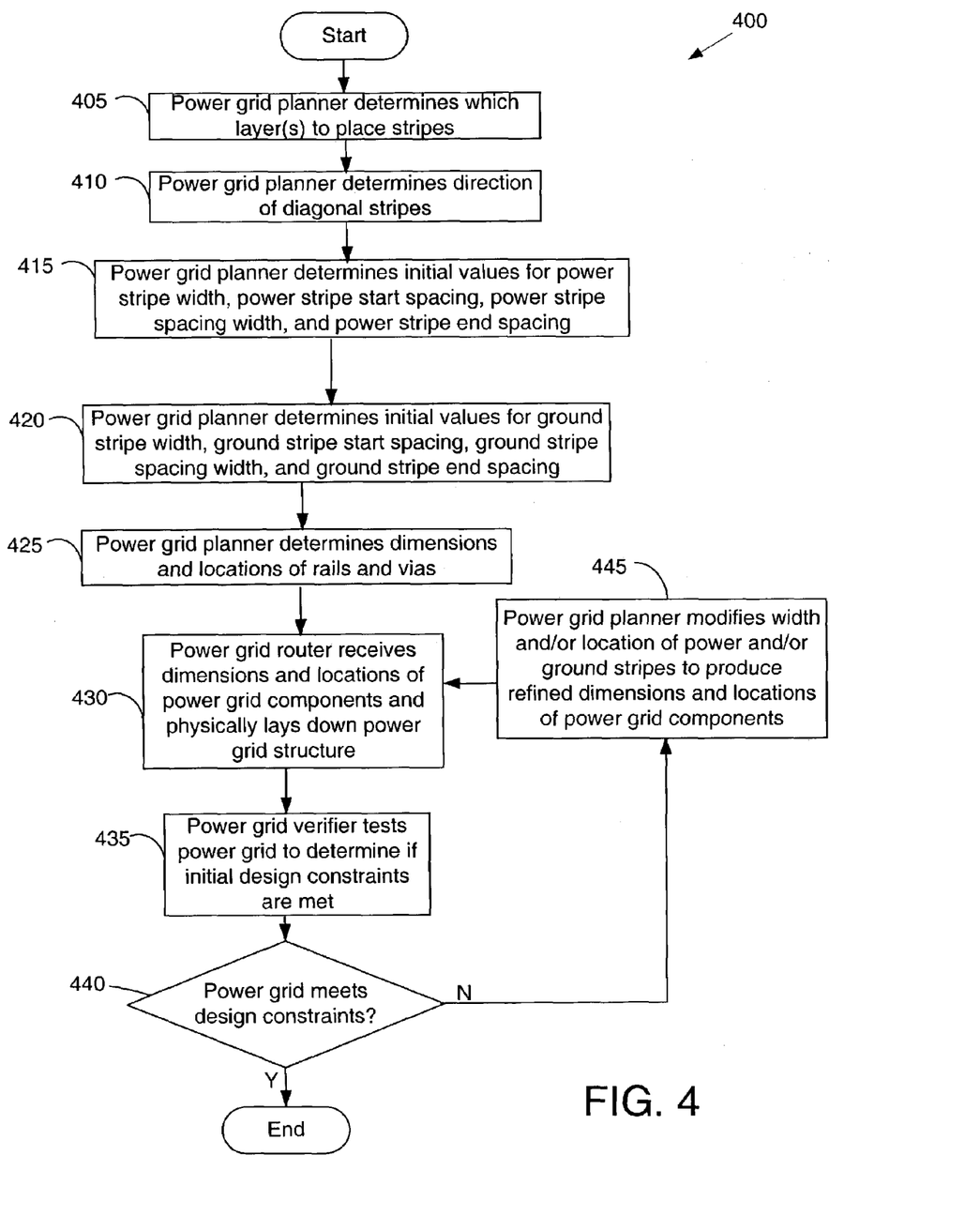
FIG. 4 shows a general process for defining and producing a power grid structure having diagonal power grid stripes.

FIG. 4 shows a general process 400 for defining and producing a power grid structure having diagonal power grid stripes. The power grid structure includes power grid structure components (i.e., power and ground stripes, rails, and vias) which are defined in an IC layout and then physically produced for use in an IC. The diagonal power grid stripes may be placed on one or more layers of the IC layout and the resulting IC (as described below in relation to FIG. 5). The general process 400 includes processes of a power grid planner, power grid router, and power grid verifier that are used iteratively to define and produce a power grid structure.

When the general process 400 begins, the power grid planner determines (at 405) which layer or layers in the IC layout to place the power and ground stripes of the power grid structure. In some embodiments, power and ground stripes are placed on layer 4 and/or layer 5 of the layout. The power grid planner then determines (at 410) the diagonal direction of the power and ground stripes for each layer on which the stripes are to be placed. In some embodiments, if the stripes are to be placed on layer 4, the stripes are placed in a 45° diagonal direction in relation to the layout's x-coordinate axis or bottom boundary. In some embodiments, if the stripes are to be placed on layer 5, the stripes are placed in a 135° diagonal direction in relation to the layout's x-coordinate axis or bottom boundary.

The power grid planner then determines (at 415) initial values for the power stripes for each layer on which the stripes are to be placed. These initial values include a power stripe width, a power stripe start spacing, a power stripe spacing width, and a power stripe end spacing (as described above in relation to FIG. 2). The power grid planner also determines (at 420) initial values for the ground stripes for each layer on which the stripes are to be placed. These initial values include a ground stripe width, a ground stripe start spacing, a ground stripe spacing width, and a ground stripe end spacing (as described above in relation to FIG. 2). The power grid planner further determines (at 425) dimensions and locations of rails and vias.

The power grid router then receives (at 430) dimensions and locations of the power grid components (i.e., power and ground stripes, rails, and vias) and physically lays down the power grid components for each layer of the IC according to the received dimensions and locations. The power grid verifier then tests (at 435) the resulting power grid structure to determine if the power grid structure meets design specifications (i.e., minimum specifications that the power grid structure must meet in order to be acceptable for use in the IC). The power grid verifier may be comprised of, for example, a Spice-based simulator. If the power grid verifier determines (at 440—Yes) that the power grid structure meets the design specifications, the general process 400 ends.

If the power grid verifier determines (at 440—No) that the power grid structure does not meet the design specifications, the power grid planner modifies (at 445) one or more values for the power stripes and/or ground stripes. For example, the power grid planner may increase the power or ground stripe widths to strengthen the power grid structure in order to meet the design specifications. Or the power grid planner may decrease the start spacing, the spacing width, or the end spacing of the power or ground stripes to allow more power or ground stripes to be placed on the layout (which also strengthens the power grid structure in order to meet the design specifications). Or the power grid planner may perform any combination of the above modifications.

The power grid planner modifies (at 445) one or more values for the power stripes and/or ground stripes to produce refined dimensions and locations of power grid. The general process 400 then repeats steps 430 through 440. As such, the dimensions and locations of the power grid components are refined through an iterative process between the power grid planner, the power grid router, and the power grid verifier until the power grid structure meets the design specifications.

Figure 5:
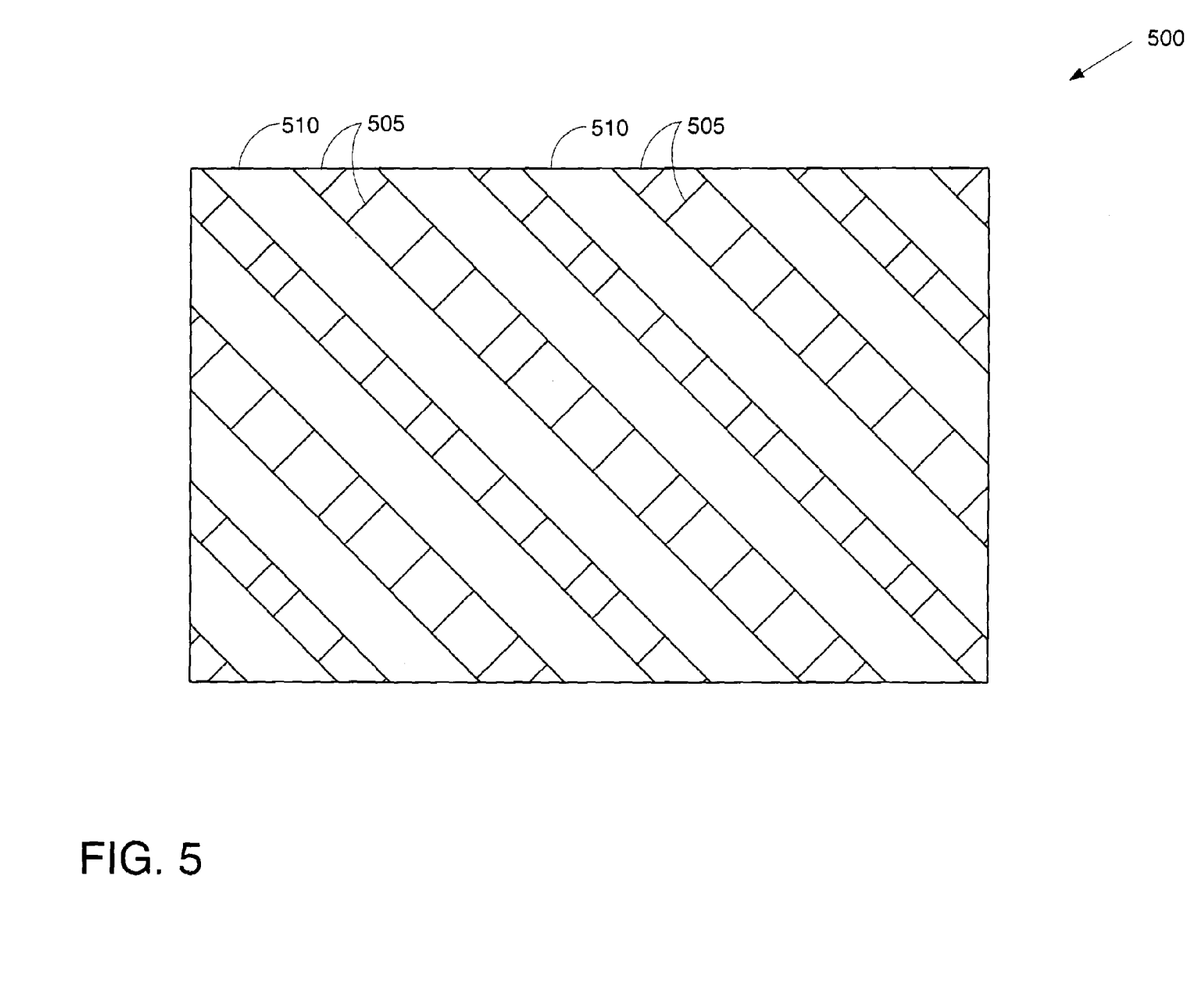
FIG. 5 illustrates a top view of a region of an IC layout having a power grid structure with 45° diagonal stripes on one layer and 135° diagonal stripes on another layer of the layout.

FIG. 4 shows a general process 400 for defining and producing a power grid structure having diagonal power grid stripes on one or more layers of a layout or an IC. FIGS. 2 and 3 show power grid structures having diagonal power grid stripes across an upper layer of an IC. In some embodiments, diagonal power grid stripes are placed on more than one upper layer of the IC. FIG. 5 illustrates a top view of a region of an IC layout having a power grid structure 500 with 45° diagonal stripes 505 on one layer and 135° diagonal stripes 510 on another layer of the layout.

The power grid structure 500 is similar to the power grid structures 200 and 300 of FIGS. 2 and 3, respectively, and only those elements that differ are discussed in detail here. In some embodiments, the 45° diagonal stripes 505 are placed on layer 4 of the six-layer wiring model (layer 4 having 45° diagonal preferred wiring) and the 135° diagonal stripes 510 are placed on layer 5 of the six-layer wiring model (layer 5 having 135° diagonal preferred wiring). In other embodiments, the 45° diagonal stripes 505 and the 135° diagonal stripes 510 are placed on other layers. In a further embodiment, Manhattan power grid stripes are placed on layer 6 of the six-layer wiring model, layer 6 having Manhattan preferred wiring.

By distributing power grid stripes over more than one layer of an IC, the power grid stripes can be made thinner on each layer while still meeting design specifications for the IC. For example, if 20 power grid stripes having a width of W being placed on one layer meets design specifications, 20 power grid stripes having a width that is a fraction of W can be placed on each of two or more layers while still meeting design specifications. As such, the signal wiring blockage caused by power grid stripes and the area occupied by the power grid stripes can be distributed or shared by more than one layer of the IC. This prevents any one layer of the IC from having excessive signal wiring blockage caused by the power grid stripes and distributes signal wiring blockage through different layers of the IC.

II. As stated above, design specifications for the power grid structure are minimum specifications that the power grid structure must meet in order to be acceptable for use in the IC. Different design specifications may be specified for a power net (a collection of power pins that need to be connected in the IC) and a ground net (a collection of ground pins that need to be connected in the IC). Design specifications may include, for example, a maximum voltage drop across the power grid structure, a threshold voltage required at each power pin of an electronic or circuit component of the IC, and/or a switching frequency threshold of the IC.

A maximum voltage drop across the power grid structure is an important design specification that ensures that each electronic and circuit component of an IC has a sufficient power supply voltage and a ground noise below a given maximum threshold. The maximum voltage drop is defined by the equation V=IR, R being typical defined by the equation R=I(pL/W), where I is the current carried by a stripe, R is the resistive value of the stripe, p is a constant, L is the length of the stripe, and W is the width of the stripe. Therefore, as the length of a stripe increases, the resistive value (R) of the stripe increases as does the voltage drop. If the length of a stripe is too great, the voltage drop will exceed the maximum voltage drop allowed for the IC (assuming that the width of the stripe remains constant).

As shown in FIGS. 2 and 3, the power grid structures 200 and 300 have diagonal stripes of varying lengths. Some stripes of the power grid structures 200 and 300 may have lengths great enough to cause the voltage drop to exceed the maximum voltage drop allowed for the IC. In some embodiments, the width (W) of particular power and/or ground stripes of the power grid structures 200 and 300 are increased. By increasing the width (W) of a stripe, the resistive value (R) of the stripe decreases as does the voltage drop. An increased width (W), therefore, can reduce the voltage drop of a stripe having a relatively greater length in order to meet the maximum voltage drop allowed for the IC. In some embodiments, the width (W) of at least one but not all power stripes of the power grid structures 200 and 300 are increased to produce a power grid structure having power stripes of varying width on an IC layer. In some embodiments, the width (W) of at least one but not all ground stripes of the power grid structures 200 and 300 are increased to produce a power grid structure having ground stripes of varying width on an IC layer.

Figure 6:
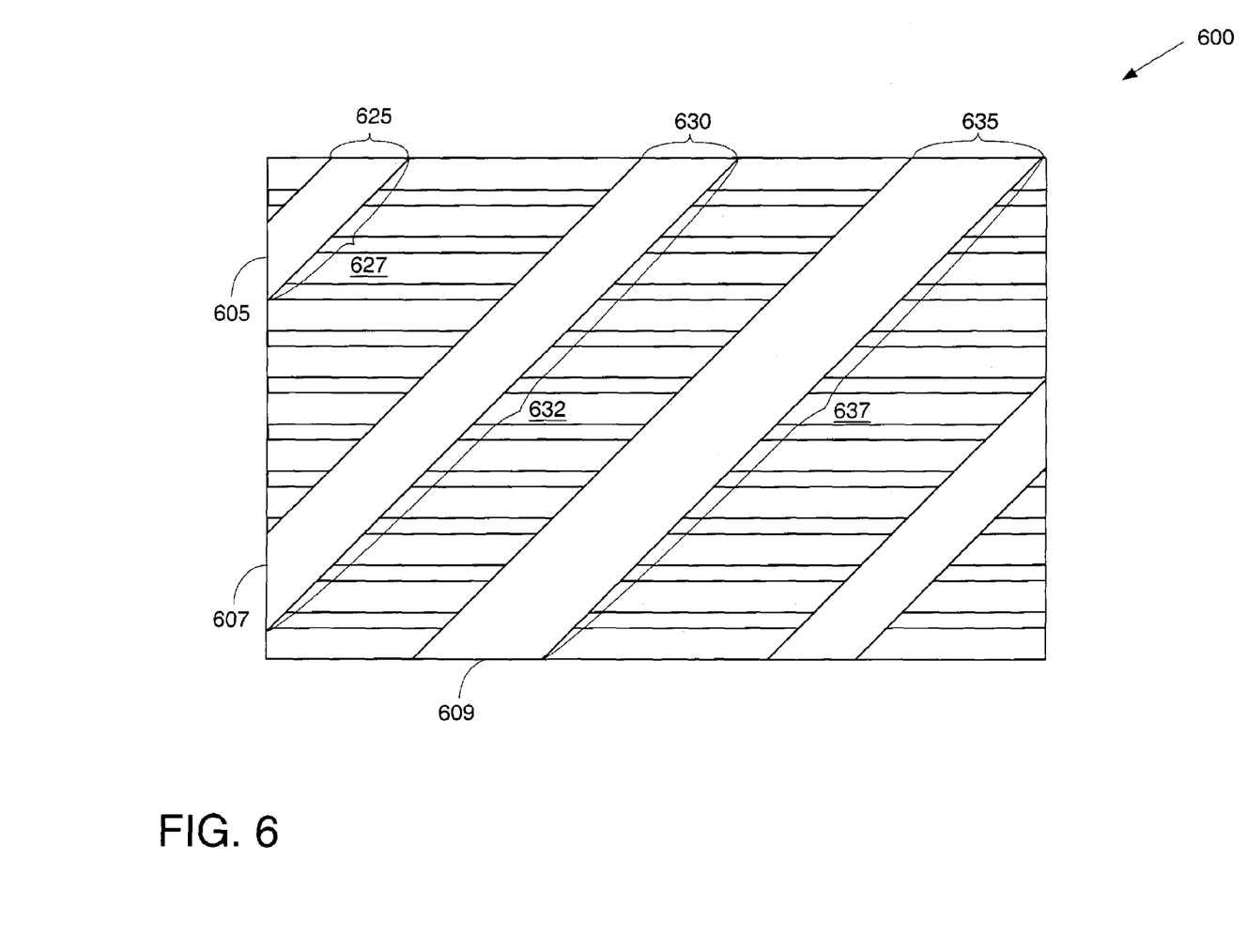
FIG. 6 illustrates a top view of a region of an IC layout having a power grid structure with diagonal power stripes having varying widths on a layer of the layout.

FIG. 6 illustrates a top view of a region of an IC layout having a power grid structure 600 with diagonal power stripes having varying (i.e., non-uniform) widths on a layer of the layout. As shown in FIG. 6, a first power stripe 605 has a first power stripe width 625 and a first power stripe length 627, a second power stripe 607 has a second power stripe width 630 and a second power stripe length 632, and a third power stripe 609 has a third power stripe width 635 and a third power stripe length 637. The third power stripe width 635 and length 637 are greater than the second power stripe width 630 and length 632, respectively, which are greater than the first power stripe width 625 and length 627, respectively. The second and third power stripes have greater widths to reduce the higher the voltage drop caused by the greater lengths of the respective stripes in order to meet the design specifications of the IC.

For illustrative purposes, only the power stripes of the power grid structure 600 are shown. The same principles described above, however, also relate to ground stripes of the power grid structure 600. Therefore, in other embodiments, the power grid structure 600 has diagonal ground stripes with varying widths.

The voltage drop of a power grid structure may also be decreased to meet design specifications by increasing the number of stripes in the power grid structure. Increasing the number of stripes allows each stripe to carry less current (I) which thereby decreases the voltage drop (which is defined by the equation V=IR).

As shown in FIGS. 2 and 3, the power grid structures 200 and 300 have diagonal stripes of varying lengths. In some embodiments, at least one stripe is added to the power grid structures 200 and 300 near stripes having relatively greater lengths. In order to add an additional stripe(s) at a particular area of a power grid structure, the spacing width between power stripes and the spacing width between ground stripes may need to be varied along a layer of the power grid structure. In some embodiments, the power grid structures 200 and 300 has diagonal power stripes and/or ground stripes having varying (i.e., non-uniform) spacing widths on an IC layer. In further embodiments, the power grid structures 200 and 300 also have diagonal power stripes and/or ground stripes having varying (i.e., non-uniform) widths.

Figure 7:
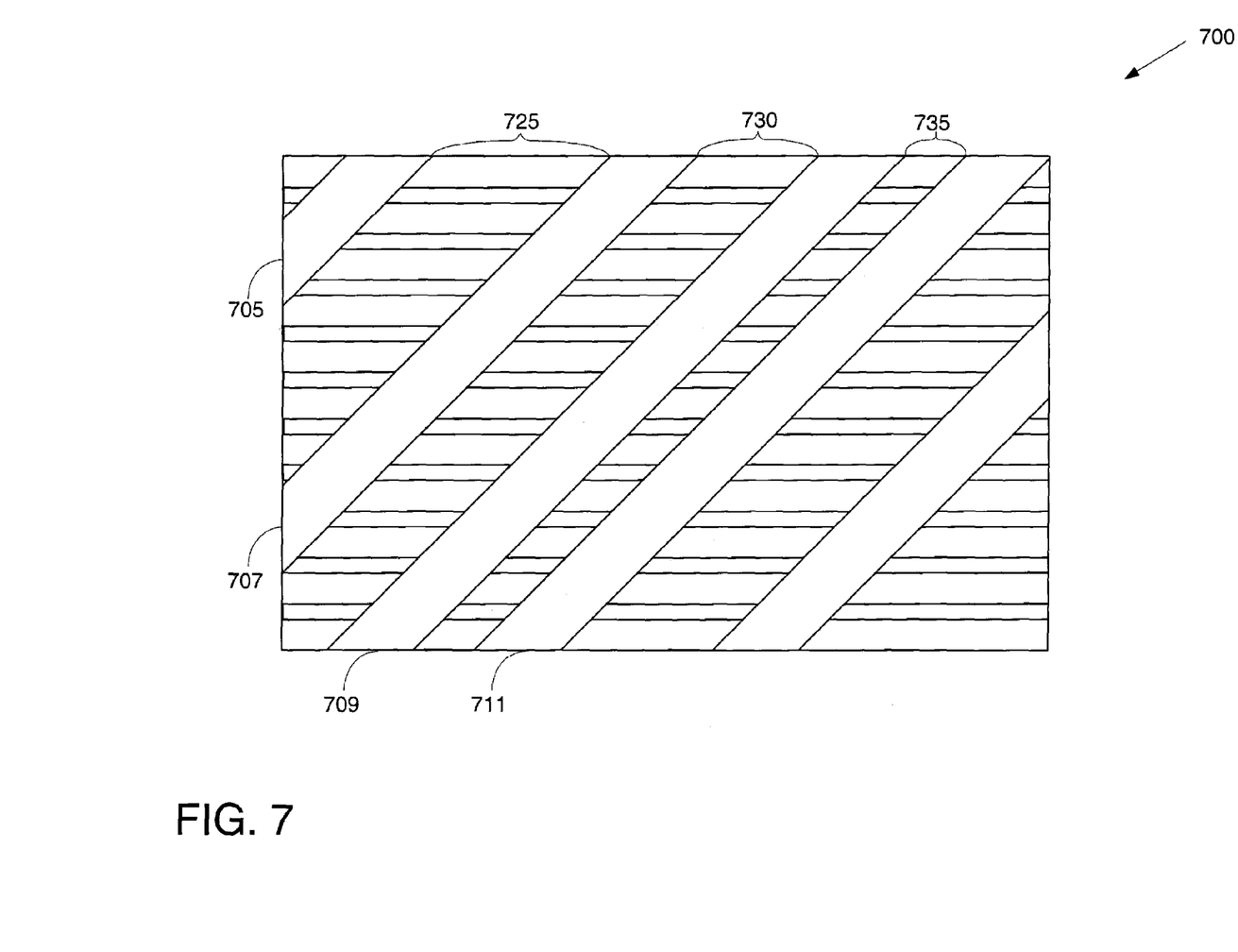
FIG. 7 illustrates a top view of a region of an IC layout having a power grid structure with diagonal power stripes having varying spacing widths on a layer of the layout.

FIG. 7 illustrates a top view of a region of an IC layout having a power grid structure 700 with diagonal power stripes having varying (i.e., non-uniform) spacing widths on a layer of the layout. As shown in FIG. 7, a first spacing width 725 separates a first power stripe 705 and a second power stripe 707, a second spacing width 730 separates the second power stripe 707 and a third power stripe 709, and a third spacing width 735 separates the third power stripe 709 and a fourth power stripe 711. The third spacing width 735 is less than the second spacing width 730, which is less than the first spacing width 725. The varied spacing widths between the power stripes allows an additional power stripe (s) (e.g., the third power stripe 709) to be added at a particular location in the power grid structure 700 (e.g., near the fourth power stripe 711 which has a relatively greater length).

For illustrative purposes, only the power stripes of the power grid structure 700 are shown. The same principles described above, however, also relate to ground stripes of the power grid structure 700. Therefore, in other embodiments, the power grid structure 700 has diagonal ground stripes having varying (i.e., non-uniform) spacing widths.

Figure 8:
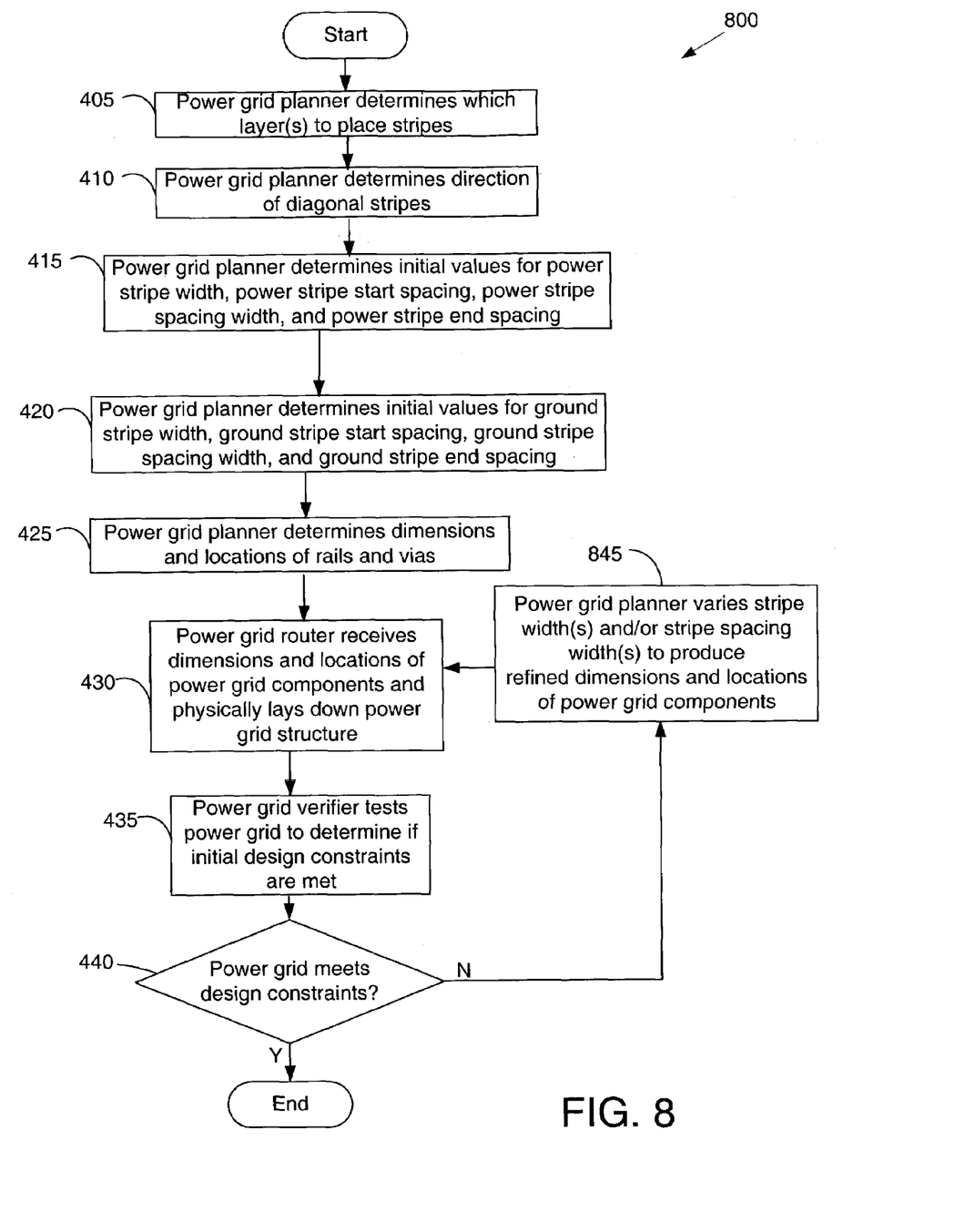
FIG. 8 shows a general process for defining and producing a power grid structure having diagonal stripes having varying widths and/or varying spacing widths.

FIG. 8 shows a general process 800 for defining and producing a power grid structure having diagonal stripes having varying widths and/or varying spacing widths. The general process 800 includes steps shown in the general process 400 of FIG. 4 and only those steps that differ are described in detail here.

The general process 800 includes processes of a power grid planner, power grid router, and power grid verifier that are used iteratively to define and produce a power grid structure. When the general process 800 begins, the power grid planner determines (at 405) which layer or layers in the IC layout to place the stripes of the power grid structure. The power grid planner then determines (at 410) a diagonal direction of the power and ground stripes.

The power grid planner then determines (at 415) initial values for the power stripes including a power stripe width, a power stripe start spacing, a power stripe spacing width, and a power stripe end spacing. In some embodiments, the power grid planner determines initial power stripe widths that are non-uniform so that at least one power stripe has a width that is not equal to the widths of the other power stripes on the same layer. In other embodiments, the power grid planner determines initial power stripe spacing widths that are non-uniform so that at least one spacing width between power stripes is not equal to other spacing widths between other power stripes on the same layer. In further embodiments, the power grid planner determines initial power stripe widths and power stripe spacing widths that are non-uniform.

The power grid planner also determines (at 420) initial values for the ground stripes including a ground stripe width, a ground stripe start spacing, a ground stripe spacing width, and a ground stripe end spacing. In some embodiments, the power grid planner determines initial ground stripe widths that are non-uniform so that at least one ground stripe has a width that is not equal to the widths of the other ground stripes on the same layer. In other embodiments, the power grid planner determines initial ground stripe spacing widths that are non-uniform so that at least one spacing width between ground stripes is not equal to other spacing widths between other ground stripes on the same layer. In further embodiments, the power grid planner determines initial ground stripe widths and ground stripe spacing widths that are non-uniform.

The power grid planner further determines (at 425) dimensions and locations of rails and vias. The power grid router then receives (at 430) dimensions and locations of the power grid components and physically lays down the power grid components for each layer of the IC according to the received dimensions and locations. The power grid verifier then tests (at 435) the resulting power grid structure to determine if the power grid structure meets design specifications. If the power grid verifier determines (at 440—Yes) that the power grid structure meets the design specifications, the general process 800 ends.

If the power grid verifier determines (at 440—No) that the power grid structure does not meet the design specifications, the power grid planner modifies (at 845) one or more values for the power stripes and/or ground stripes. For example, the power grid planner may increase the width of one or more power or ground stripe(s). In some embodiments, the width of a power or ground stripe(s) having a relatively longer length is increased. As a further example, the power grid planner may add one or more power and/or ground stripe(s) near a particular existing stripe. In some embodiments, a power and/or ground stripe(s) is added near an existing stripe having a relatively longer length. In order to add the one or more power and/or ground stripe(s), the power grid planner may vary the spacing width between power stripes and/or vary the spacing width between ground stripes in order to place the additional stripe(s) at a particular area of the power grid structure. In further embodiments, the power grid planner may perform any combination of the above modifications.

The power grid planner modifies (at 845) one or more values for the power stripes and/or ground stripes to produce refined dimensions and locations of power grid. The general process 800 then repeats steps 430 through 440. As such, the dimensions and locations of the power grid components are refined through an iterative process between the power grid planner, the power grid router, and the power grid verifier until the power grid structure meets the design specifications.

In the embodiments described above, the power grid structure is described in relation to a six-layer wiring model that has horizontal signal wiring on wiring layer 1, vertical signal wiring on wiring layer 2, horizontal signal wiring on wiring layer 3, 45° diagonal signal wiring on wiring layer 4, 135° diagonal signal wiring on wiring layer 5, and vertical wiring on wiring layer 6. One of ordinary skill in the art will realize that the power grid structure can be used in other wiring models in other embodiments.

In some embodiments, a power grid stripe is "diagonal" if it forms an angle other than 0° or 90° with respect to the IC layout's Cartesian coordinate axes, which are typically parallel with the layout's boundary and/or the boundary of the layout's expected IC. A power grid stripe that is "diagonal" with respect to the IC layout's (or a region of the layout's) coordinate axes or boundary is also "diagonal" (i.e., forms an angle other than 0° or 90°) with respect to the boundary of the resulting IC and the boundary of the resulting layer on which the stripe is placed. In some embodiments, power grid structures having stripes with the specific diagonal directions of 45° or 135° are described. Other embodiments, however, include power grid structures having stripes with the other diagonal directions.

Several embodiments have been described above in relation to power grid structures having diagonal stripes. These embodiments may be combined with methods for defining power grid structures having minimized power grid structure areas and minimized diagonal wiring blockage caused by the power grid structure while still meeting design specifications. The above described embodiments may also be combined with methods for determining dimensions and locations of power grid components using a power grid formula and a set of constraints as used in an iterative process involving a power grid planner, a power grid router, a power grid verifier, and a global signal router. Such methods are described in U.S. patent application Ser. No. 10/452,100, entitled "Methods and Apparatus for Defining Manhattan Power Grid Structures Beneficial to Diagonal Signal Wiring," filed herewith and hereby expressly incorporated herein by reference.

In addition, the above described embodiments may be combined with methods for reducing the number of vias in a power grid structure (while still meeting design specifications) and methods for locating vias in the power grid structure in such a way as to be especially beneficial to 45° or 135° diagonal wiring paths. Such methods are described in U.S. patent application Ser. No. 10/452,189, entitled "Methods and Apparatus for Defining Manhattan Power Grid Structures Having a Reduced Number of Vias," filed herewith and hereby expressly incorporated herein by reference. The above described embodiments may also be combined with arrangements of vias in via arrays where diagonal wiring paths are facilitated near the edges of the via arrays, as described in the aforementioned U.S. Patent Application entitled "Methods and Apparatus for Defining Manhattan Power Grid Structures Having a Reduced Number of Vias."

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A power grid structure for an integrated circuit, the power grid structure comprising:
   a first plurality of stripes located on a first layer of the integrated circuit, the first plurality of stripes being positioned in a diagonal direction in relation to the boundary of the integrated circuit;
   a plurality of rails; and
   a plurality of vias that connect the first plurality of stripes to the plurality of rails.

2. The power grid structure of claim 1 wherein the first plurality of stripes are positioned in a 45° diagonal direction in relation to the boundary of the integrated circuit.

3. The power grid structure of claim 2 wherein the first layer has 45° diagonal preferred signal wiring.

4. The power grid structure of claim 1 wherein the first plurality of stripes are positioned in a 135° diagonal direction in relation to the boundary of the integrated circuit.

5. The power grid structure of claim 4 wherein the first layer has 135° diagonal preferred signal wiring.

6. The power grid structure of claim 1 further comprising:
   a second plurality of stripes located on a second layer of the integrated circuit, the second plurality of stripes being positioned in a diagonal direction in relation to the boundary of the integrated circuit.

7. The power grid structure of claim 6 wherein the first plurality of stripes located on the first layer are positioned in a 45° diagonal direction in relation to the boundary of the integrated circuit, the first layer having 45° diagonal preferred signal wiring.

8. The power grid structure of claim 7 wherein the second plurality of stripes located on the second layer are positioned in a 135° diagonal direction in relation to the boundary of the integrated circuit, the second layer having 135° diagonal preferred signal wiring.

9. The power grid structure of claim 1 wherein the first plurality of stripes comprise all stripes located on the first layer.

10. The power grid structure of claim 1 wherein the first plurality of stripes comprise a portion of all stripes located on the first layer.

11. The power grid structure of claim 1 wherein the first plurality of stripes comprise over ¼ of all stripes located on the first layer.

12. A power grid structure for an integrated circuit, the power grid structure being defined in a region of a layout of the integrated circuit, the power grid structure comprising:
   a plurality of stripes located on a layer of the integrated circuit, the plurality of stripes being defined in a diagonal direction in relation to the boundary of the layout;
   a plurality of rails; and
   a plurality of vias that connect the plurality of stripes to the plurality of rails.

13. The power grid structure of claim 12 wherein the plurality of stripes are defined in a 45° diagonal direction in relation to the boundary of the layout.

14. The power grid structure of claim 12 wherein the plurality of stripes are defined in a 135° diagonal direction in relation to the boundary of the layout.

15. A method of defining a power grid structure in a region of a layout, the power grid structure being comprised of a first plurality of power stripes and a first plurality of ground stripes, the method comprising:

determining a first layer in the layout on which the first plurality of power stripes and the first plurality of ground stripes are to be placed;

determining a first diagonal direction in which the first plurality of power stripes and the first plurality of ground stripes are to be positioned, the diagonal direction being in relation to the boundary of the layout;

determining values for the first plurality of power stripes including values for a power stripe width, a power stripe start spacing, a power stripe spacing width, and a power stripe end spacing; and determining values for the first plurality of ground stripes including values for a ground stripe width, a ground stripe start spacing, a ground stripe spacing width, and a ground stripe end spacing.

16. The method of claim 15 wherein the first diagonal direction is a 45° diagonal direction in relation to the boundary of the layout.

17. The method of claim 16 wherein the first layer has 45° diagonal preferred signal wiring.

18. The method of claim 15 wherein the first diagonal direction is a 135° diagonal direction in relation to the boundary of the layout.

19. The method of claim 18 wherein the first layer has 135° diagonal preferred signal wiring.

20. The method of claim 15 wherein:

the power stripe start spacing is a distance from an edge of the region of the layout to a first power stripe in the first plurality of power stripes;

the power stripe spacing width is a distance separating a power stripe and a next power stripe of the first plurality of power stripes;

the power stripe end spacing is a distance from the edge of the region of the layout to a last power stripe of the first plurality of power stripes;

the ground stripe start spacing is a distance from an edge of the region of the layout to a first ground stripe in the first plurality of ground stripes;

the ground stripe spacing width is a distance separating a ground stripe and a next ground stripe of the first plurality of ground stripes; and the ground stripe end spacing is a distance from the edge of the region of the layout to a last ground stripe of the first plurality of ground stripes.

21. The method of claim 15 wherein the power grid structure is further comprised of a second plurality of power stripes and a second plurality of ground stripes, the method further comprising:

determining a second layer in the layout on which the second plurality of power stripes and the second plurality of ground stripes are to be placed; and determining a second diagonal direction in which the second plurality of power stripes and the second plurality of ground stripes are to be positioned, the second diagonal direction being in relation to the boundary of the layout.

22. The method of claim 21 wherein the first layer has 45° diagonal preferred signal wiring and the first diagonal direction is a 45° diagonal direction in relation to the boundary of the layout.

23. The method of claim 22 wherein the second layer has 135° diagonal preferred signal wiring and the second diagonal direction is a 135° diagonal direction in relation to the boundary of the layout.

* * * * *